US012526953B2

United States Patent
Chung et al.

(10) Patent No.: US 12,526,953 B2
(45) Date of Patent: Jan. 13, 2026

(54) PORTABLE ELECTRONIC DEVICE

(71) Applicant: ASUSTeK COMPUTER INC., Taipei (TW)

(72) Inventors: Cheng-Han Chung, Taipei (TW);
Ching-Yuan Yang, Taipei (TW);
Chui-Hung Chen, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 640 days.

(21) Appl. No.: 17/963,200

(22) Filed: Oct. 11, 2022

(65) Prior Publication Data

US 2023/0138376 A1 May 4, 2023

(30) Foreign Application Priority Data

Nov. 3, 2021 (TW) ................................ 110140925

(51) Int. Cl.
*H05K 7/20* (2006.01)
(52) U.S. Cl.
CPC ................................ *H05K 7/20172* (2013.01)
(58) Field of Classification Search
CPC ............. H05K 7/20172; H05K 7/0213; H05K 7/20145; H05K 7/20209; H05K 7/20409; H05K 7/20972; H05K 7/20136; H05K 7/20163; H05K 7/20963; H05K 7/20154; G06F 1/1677; G06F 1/203; G06F 1/20
See application file for complete search history.

(56) References Cited

U.S. PATENT DOCUMENTS

| | | | |
|---|---|---|---|
| 8,976,524 B2 | 3/2015 | Wang et al. | |
| 10,149,405 B2 | 12/2018 | Chou et al. | |
| 10,824,205 B2 * | 11/2020 | Lin | G06F 1/203 |
| 2017/0153677 A1 * | 6/2017 | Cheng | G06F 1/1637 |
| 2019/0094918 A1 * | 3/2019 | Lin | G06F 1/1681 |
| 2019/0250674 A1 * | 8/2019 | Lin | G06F 1/1616 |
| 2019/0278345 A1 * | 9/2019 | Ye | H05K 5/0234 |
| 2021/0089077 A1 * | 3/2021 | Wang | G06F 1/3287 |

FOREIGN PATENT DOCUMENTS

| | | |
|---|---|---|
| CN | 2632992 | 8/2004 |
| CN | 2829306 | 10/2006 |
| CN | 101841098 | 4/2012 |
| CN | 103176526 | 5/2016 |
| CN | 206195848 | 5/2017 |
| CN | 108073222 | 5/2018 |
| CN | 210491127 | 5/2020 |
| CN | 210954800 | 7/2020 |
| TW | M615481 | 8/2021 |

* cited by examiner

Primary Examiner — Jayprakash N Gandhi
Assistant Examiner — Matthew Sinclair Muir
(74) Attorney, Agent, or Firm — JCIPRNET

(57) ABSTRACT

A portable electronic device is provided. The portable electronic device includes a housing, a heat dissipation element, a bracket, a drive connecting rod, and a door cover structure. The housing is provided with the heat dissipation opening. The heat dissipation element is disposed in the housing and corresponds to the heat dissipation opening. The bracket is disposed in the housing and frames the heat dissipation element. The drive connecting rod is pivotally connected to the bracket and is adapted to be driven to rotate. The door cover structure is coupled to the bracket, where the drive connecting rod is pivotally connected to the door cover structure to drive the door cover structure to move to cover or expose the heat dissipation opening.

16 Claims, 19 Drawing Sheets

PORTABLE ELECTRONIC DEVICE

CROSS-REFERENCE TO RELATED APPLICATION

This application claims the priority benefit of Taiwan Application Serial No. 110140925, filed on Nov. 3, 2021. The entirety of the above-mentioned patent application is hereby incorporated by reference herein and made a part of the specification.

BACKGROUND OF THE INVENTION

Field of the Invention

The disclosure relates to a portable electronic device.

Description of the Related Art

In recent years, as mobile communication technologies are highly developed, many novel applications have been created. In addition, various novel portable electronic devices are continuously brought forth. Through continuous improvement, central processing units (CPUs) of existing portable electronic devices have considerable computing power, and support a plurality of software operations while providing excellent use convenience. However, generally, for the convenience of users to carry and use portable electronic devices, the design of integrating a fan in a portable electronic device, such as a smart phone, a tablet computer, or a wearable device, is relatively rare because the fan has a large volume and generates some noise during operation. Therefore, to enable CPUs of portable devices to maintain operating at relatively high power and efficiency, it is necessary to provide additional heat dissipation capabilities for the portable devices.

BRIEF SUMMARY OF THE INVENTION

According to an aspect of the disclosure, a portable electronic device includes a housing, a heat dissipation element, a bracket, a drive connecting rod, and a door cover structure. The housing includes a heat dissipation opening. The heat dissipation element is disposed in the housing and corresponds to the heat dissipation opening. The bracket is disposed in the housing and frames the heat dissipation element. The drive connecting rod is pivotally connected to the bracket and is adapted to be driven to rotate. The door cover structure is coupled to the bracket, and the drive connecting rod is pivotally connected to the door cover structure to drive the door cover structure to move to cover or expose the heat dissipation opening.

Based on the above, a housing of a portable electronic device disclosed in the disclosure includes a heat dissipation opening, used to expose at least a part of the heat dissipation element in the housing. The portable electronic device further includes a door cover structure, and drives the door cover structure to move through a drive connecting rod pivotally connected between the bracket and the door cover structure to cover or expose the heat dissipation opening. Elements, such as the door cover structure and the drive connecting rod, are assembled in the portable electronic device in a modular manner through the bracket. With this configuration, when the portable electronic device has a high heat dissipation requirement, the door cover structure is opened manually or automatically to facilitate heat dissipation. Therefore, the portable electronic device has higher heat dissipation efficiency. In addition, the modular design also simplifies cumbersome assembly steps.

DETAILED DESCRIPTION OF THE EMBODIMENTS

Figure 1:
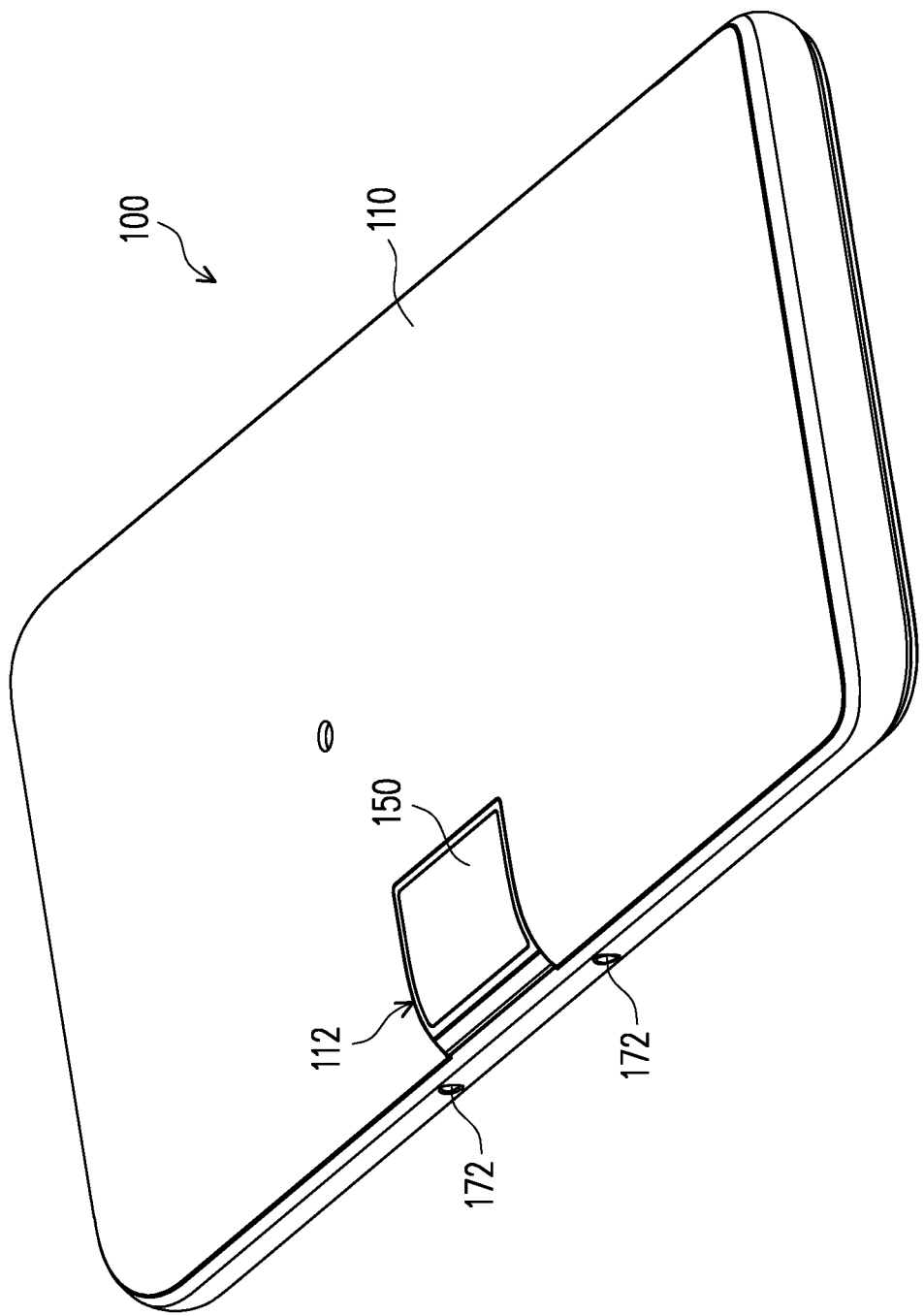
FIG. 1 is a schematic diagram of a portable electronic device according to an embodiment of the disclosure.
Figure 2:
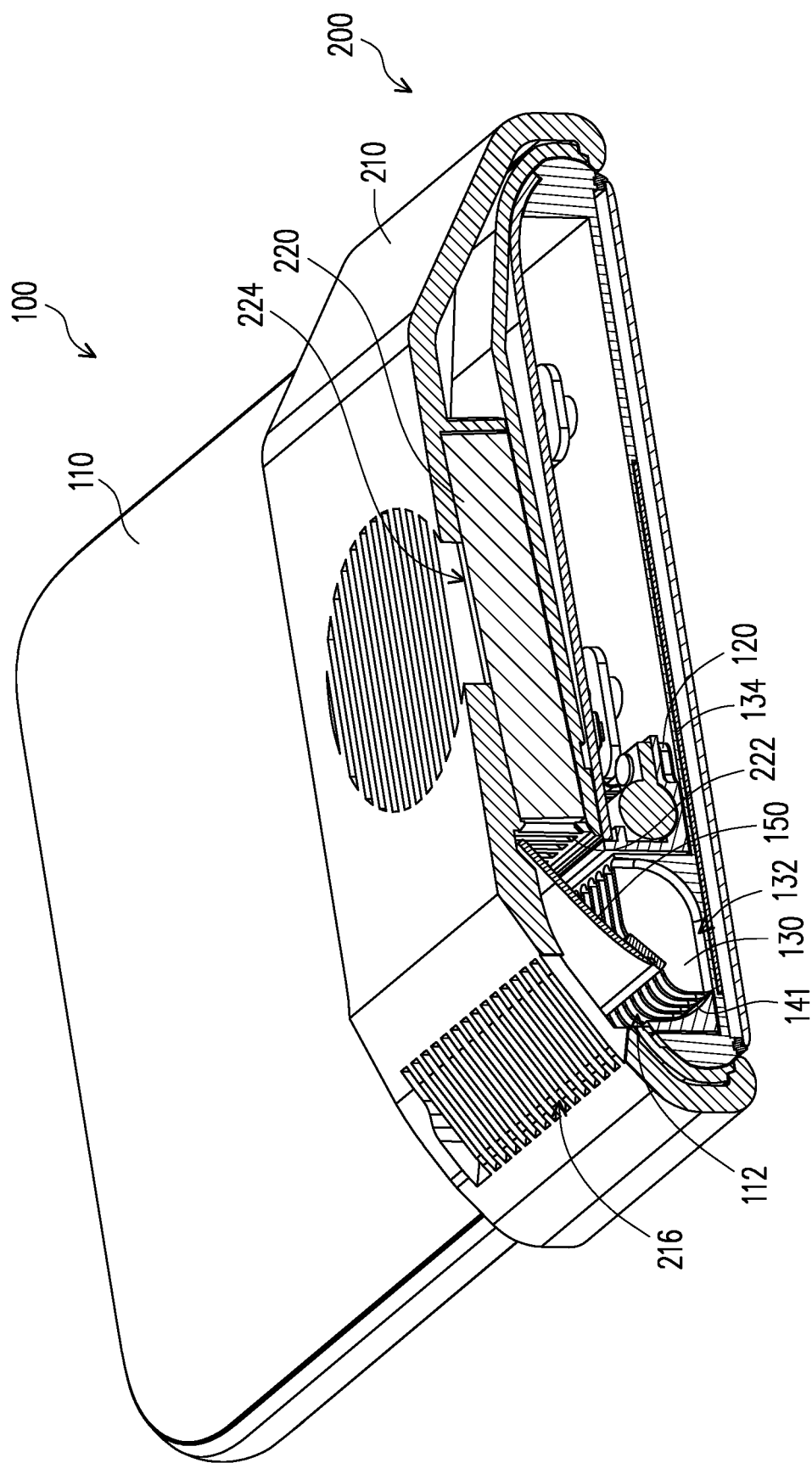
FIG. 2 is a schematic cross-sectional diagram of a portable electronic device cooperating with a fan module according to an embodiment of the disclosure.
Figure 3:
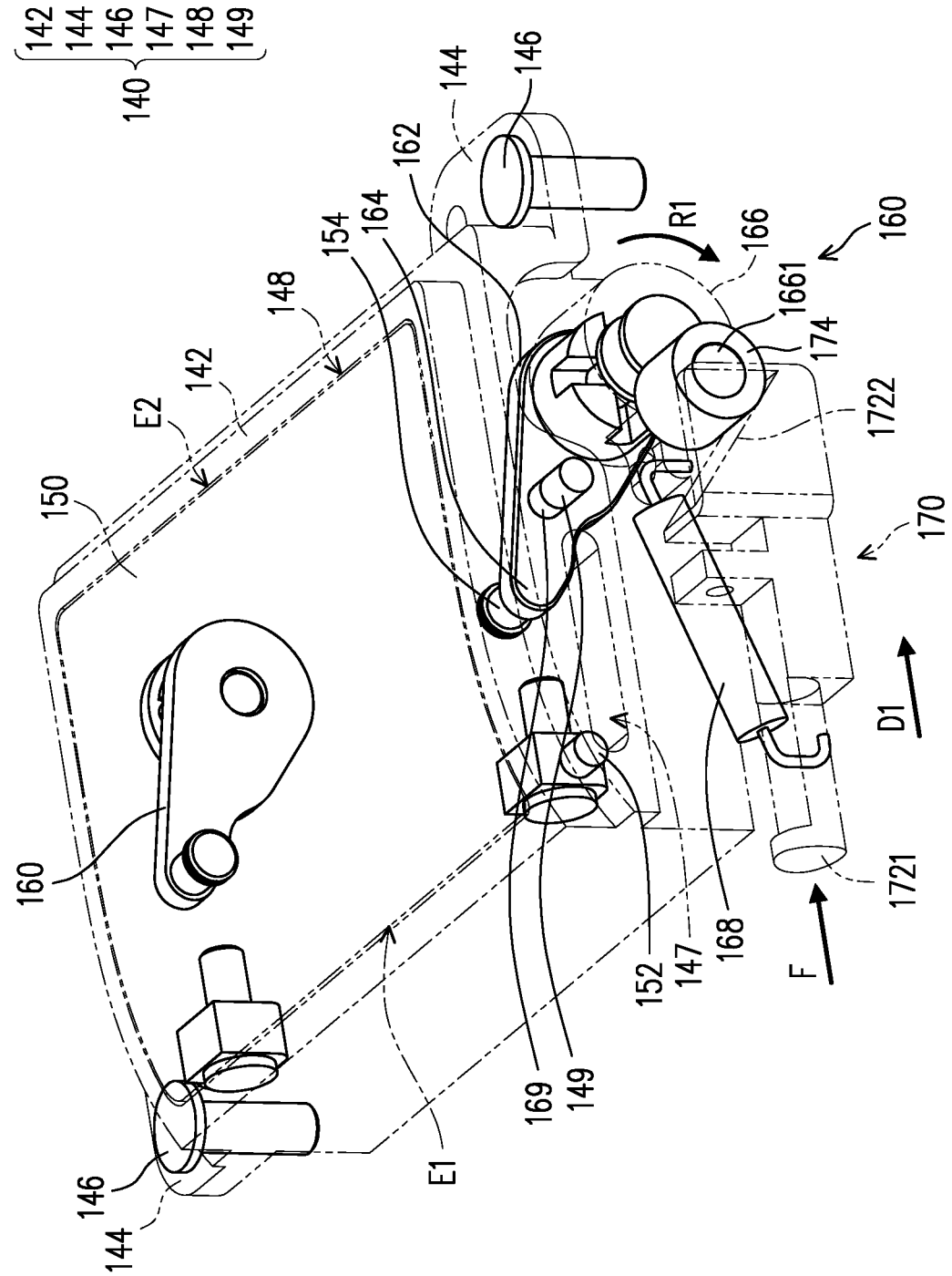
FIG. 3 is a schematic diagram of a door cover structure of a portable electronic device in a closed position according to an embodiment of the disclosure.

Referring to FIG. 1 to FIG. 3, in an embodiment, a portable electronic device 100 includes a housing 110, a heating element (not shown), a heat dissipation element 130, a bracket 140, a drive connecting rod 160, and a door cover structure 150. The housing 110 is used to define an accommodating space, and includes a heat dissipation opening 112 on a surface thereof. It should be noted that although a smart phone is always used below as an example to describe the content of the disclosure. A person of ordinary skill in the art should understand that the smart phone is replaceable with another portable electronic device. In this embodiment, the heat dissipation opening 112 is, in an embodiment, located on the back of the portable electronic device 100. The heating element is disposed in the accommodating space defined by the housing 110. In some embodiments, the heating element is, in an embodiment, a CPU or another type of heating element of the portable electronic device 100, and is configured on a circuit board in the housing 110. The heat dissipation element 130 includes a cooling fin assembly, thermally coupled to the heating element. In another embodiment, the heat dissipation element 130 is alternatively configured around a heat generating element. The heat dissipation element 130 and the heat generating element are connected by elements such as a vapor chamber to facilitate heat dissipation. In some embodiments, a contact surface between the heat dissipation element 130 and the heating element or the vapor chamber is coated with a heat conductive paste to enhance the heat transfer efficiency, but the disclosure is not limited thereto.

In an embodiment, the heat dissipation element 130 is disposed in the housing 110 and corresponds to the heat dissipation opening 112. In other words, the heat dissipation opening 112 of the housing 110 exposes at least a part of the heat dissipation element 130 (in an embodiment, cooling fins), so as to improve the heat dissipation efficiency of the heat dissipation element 130. In this embodiment, the heat dissipation element 130 is a passive heat dissipation element, but the disclosure is not limited thereto. In an embodiment, a material of the heat dissipation element (fin) 130 is the same as a material of the housing 110. Moreover, the heat dissipation element 130 is a portion extending from the housing 110. Certainly, in another embodiment, the heat dissipation element 130 is alternatively a separate heat dissipation (fin) part, and is fixed in the portable electronic device 100, in an embodiment, in a manner such as welding.

Figure 4:
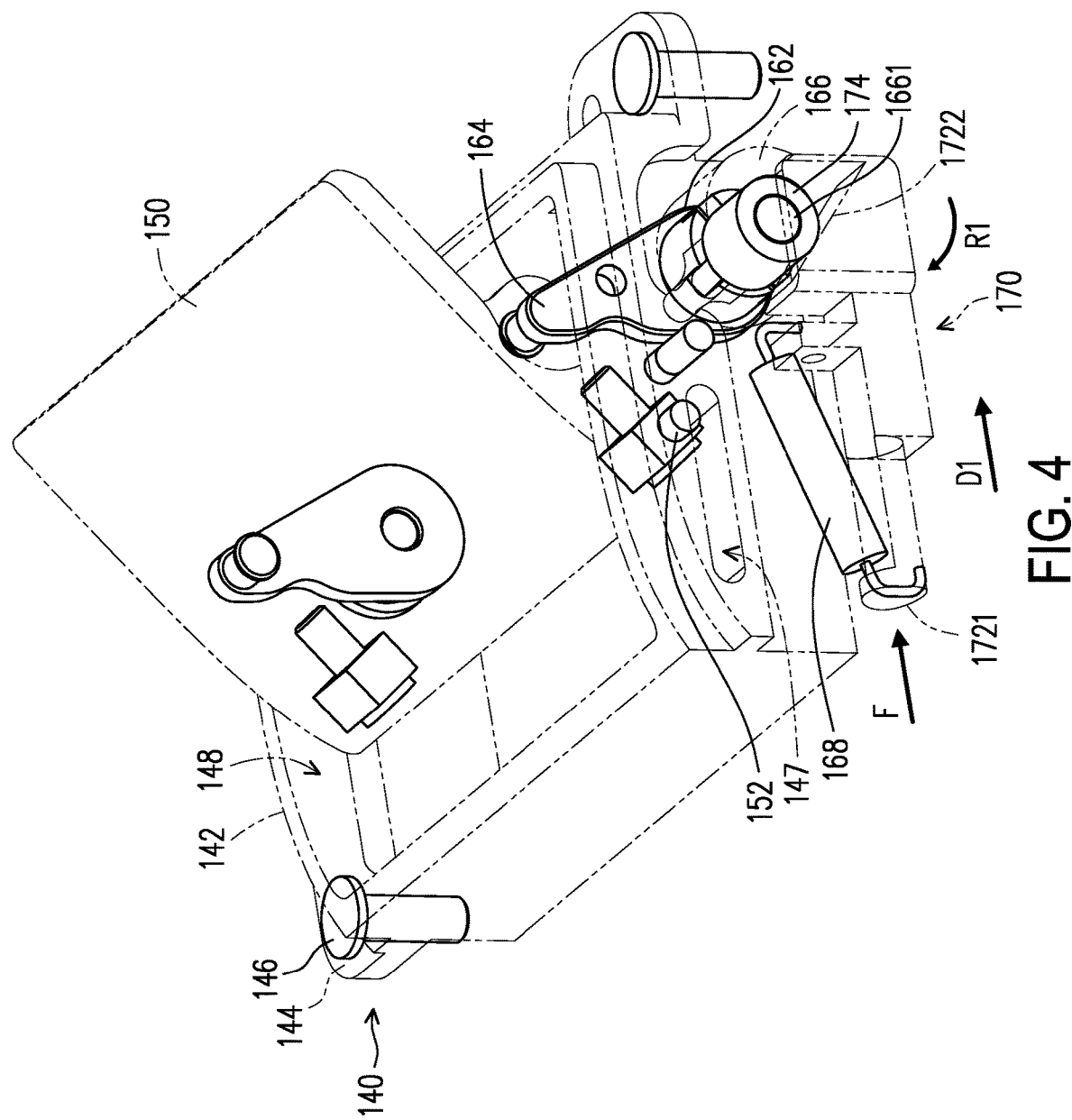
FIG. 4 is a schematic diagram of a door cover structure of the portable electronic device in FIG. 3 in an open position.

Referring to both FIG. 3 and FIG. 4, in some embodiments, the bracket 140 is disposed in the housing 110 and frames the heat dissipation element 130. In an embodiment, the bracket 140 is locked on, in an embodiment, a bottom plate of the housing 110 through a locking member 146, but the disclosure is not limited thereto. In this embodiment, the bracket 140 includes a framing portion 142 and a fixing portion 144. The framing portion 142 is configured to frame the heat dissipation element 130 and define a bracket opening 148. The bracket opening 148 corresponds to the heat dissipation opening 112 of the housing 110 to jointly expose the heat dissipation element 130. The fixing portion 144 is disposed around the framing portion 142 and includes a locking hole for the locking member 146 to lock.

In an embodiment, the door cover structure 150 is coupled to the bracket 140 and corresponds to the heat dissipation opening 112. In this embodiment, the door cover structure 150 is configured to be driven to move relative to the bracket 140 (in an embodiment, linearly moves, rotates, and/or rolls) to cover and/or expose the heat dissipation opening 112. In this embodiment, the drive connecting rod 160 is pivotally connected between the bracket 140 and the door cover structure 150, and is driven to rotate, to drive the door cover structure 150 to move between a closed position (the closed position shown in FIG. 3) for covering the heat dissipation opening 112 and an open position (the open position shown in FIG. 4) for exposing the heat dissipation opening 112 and the heat dissipation element 130 below.

In an embodiment, the portable electronic device 100 further includes a push rod 172 and a drive roller 174 connected to the drive connecting rod 160. In an embodiment, the drive connecting rod 160 further includes an axle end 162 and a pivot end 164 opposite to each other, where the drive roller 174 is connected to the axle end 162, to drive the axle end 162 to rotate, and the pivot end 164 is pivotally connected to the door cover structure 150, to drive the door cover structure 150 to move (rise or fall and rotate). Further, the drive connecting rod 160 further includes a driver 166 engaged with the axle end 162, and a protruding portion 1661 of the driver 166 passes through an axis of the drive roller 174. In some embodiments, the driver 166 and the axle end 162 are engaged with each other through a form-fitting engagement structure (in an embodiment, the axle end 162 includes a cross engaging groove, and the driver 166 include a cross engaging rib, which are not limited thereto). Directions of an engaging groove and an engaging rib are different from a rotation direction R1 to prevent engagement between the driver 166 and the axle end 162 from being loosened due to reciprocating rotation. The push rod 172 further includes a stressed portion 1721 and a slope portion 1722. In such configuration, to cause the door cover structure 150 to expose the heat dissipation opening 112 for heat dissipation, an external force F is applied to the stressed portion 1721 of the push rod 172, to move the push rod 172 in a moving direction D1 toward the drive roller 174, so as to further force the drive roller 174 to lift upward along the slope portion 1722 to a position shown in FIG. 4. Therefore, a protruding portion 1661 is pulled up to drive the axle end 162 of the drive connecting rod 160 to rotate in a rotation direction R1, so as to further lift the door cover structure 150 upward.

Further, the bracket 140 further includes a slide rail 147. The door cover structure 150 includes a slider 152 and a pivot portion 154. The slider 152 is slidably disposed in the slide rail 147 to move (in an embodiment, linearly move, rotate, and/or roll) along the slide rail 147. The pivot portion 154 is pivotally connected to the drive connecting rod 160. In this embodiment, the door cover structure 150 includes a first end E1 and a second end E2 opposite to each other. The slider 152 is disposed at the first end E1. The pivot portion 154 is located between the first end E1 and the second end E2, to serve as a pivot point. In this way, when the drive connecting rod 160 drives the pivot portion 154 of the door cover structure 150 to lift (rotate) upward (away from the bracket), the slider 152 at the first end E1 moves along the slide rail 147 in a moving direction D1, to further cause the pivot portion 154 of the door cover structure 150 to rotate relative to the drive connecting rod 160 to open the door cover structure 150. In some embodiments, the drive connecting rod 160, the slide rail 147, and the push rod 172 are symmetrically disposed on two opposite sides of the bracket 140 to improve the smoothness of a stroke of the door cover structure 150 between a closed position shown in FIG. 3 and an open position shown in FIG. 4.

In this embodiment, the portable electronic device 100 includes a temperature sensor, disposed on the heating element to sense a temperature of the heating element. When the temperature sensor detects that a temperature of the heating element is higher than a warning temperature, a prompt pops up on a display of the portable electronic device 100, in an embodiment, so that a user manually opens the door cover structure 150 (in an embodiment, apply an external force F to push the push rod 172) to expose the heat dissipation element 130 and help the heat dissipation element 130 dissipate heat. In some embodiments, when the temperature sensor detects that a temperature of the heating element is higher than a warning temperature, the portable electronic device 100 alternatively opens or closes the door cover structure by cooperating with another device (in an embodiment, a heat dissipation kit such as a fan module). In another embodiment, the portable electronic device 100 alternatively automatically controls the door cover structure 150 to change from a closed position to an open position, to facilitate heat dissipation. The disclosure is not limited thereto.

Referring to FIG. 2, in some embodiments, the portable electronic device 100 cooperates with another heat dissipation kit, to further help the heating element and the heat dissipation element 130 dissipate heat. In this embodiment, the portable electronic device 100 includes a fan module 200 sleeved on the housing 110. In this way, when there is a relatively high need for heat dissipation, the fan module 200 is sleeved on the housing 110, to be combined with the portable electronic device 100 and help the portable electronic device 100 dissipate heat. The fan module 200 includes a base 210 and a fan assembly 220. The base 210 is in a shape fit with at least a part of the housing 110, to be sleeved on the housing 110 of the portable electronic device 100. In addition, the base 210 includes an air outlet 216 corresponding to the heat dissipation opening 112 of the housing 110. In some embodiments, the fan module 200 includes a drive rod (not shown), which is, in an embodiment, a protruding rod disposed on an inner surface of the base 210 to form a shape fit with at least a part of the housing 110 on the base 210. While being sleeved on the housing 110 of the portable electronic device 100, the drive rod of the fan module 200 pushes against the push rod 172, to push the push rod 172 inward in the moving direction D1, thereby driving the door cover structure 150 to rotate and lift upward to an open position.

In an embodiment, the fan assembly 220 includes at least one fan. When the fan module 200 is sleeved on the portable electronic device 100, the door cover structure 150 is in an open position. In this case, an air outlet 222 of the fan assembly 220 faces the heat dissipation element 130, and the door cover structure 150 extends between the air outlet 222 and the heat dissipation element 130. Therefore, the door cover structure 150 in the open position also has a flow guiding function. In addition, an air inlet 224 of the fan assembly 220 is located on a surface of the fan away from the back of the portable electronic device 100. In such configuration, when the fan module 200 is sleeved on the housing 110, the door cover structure 150 is opened simultaneously for heat dissipation, and the fan assembly 220 provides a cooling air flow, which is guided by the door cover structure 150 to flow to the heat dissipation element 130, to help the heat dissipation element 130 dissipate heat.

In an embodiment, the heat dissipation element 130 includes an arc-shaped flow guide groove 132. The bracket 140 further includes an arc-shaped flow guide surface 141 facing the heat dissipation element 130, to define an arc-shaped flow path together with the arc-shaped flow guide groove 132, so that cold air flows into and out of the housing 110 along the arc-shaped flow path without staying in a dead-angle (right-angle) region in the housing 110, thereby further improving the heat dissipation efficiency.

In some embodiments, the drive connecting rod 160 further includes at least one elastic restoring member 168 (which is shown as one, but is not limited thereto), connected between the drive connecting rod 160 and the bracket 140, so that after an external force of pushing the push rod 172 disappears, the drive connecting rod 160 is pulled back to the closed position shown in FIG. 3 by an elastic restoring force of the elastic restoring member 168. In some embodiments, the elastic restoring member 168 is a tension spring, but is not limited thereto. In some embodiments, the portable electronic device 100 further includes at least one first magnetic element 149 and a second magnetic element 169, where the first magnetic element 149 is disposed on the bracket 140, and the second magnetic element 169 is correspondingly disposed on the drive connecting rod 160 or the door cover structure 150, and corresponds to the first magnetic element 149 when being disposed in a closed position, so that when the door cover structure 150 is in the closed position, a closed state of the door cover structure 150 is further stabilized by the property of mutual attraction between the first magnetic element 149 and the second magnetic element 169. In this embodiment, the second magnetic element 169 is correspondingly disposed on the drive connecting rod 160, but this embodiment is not limited thereto.

Figure 5:
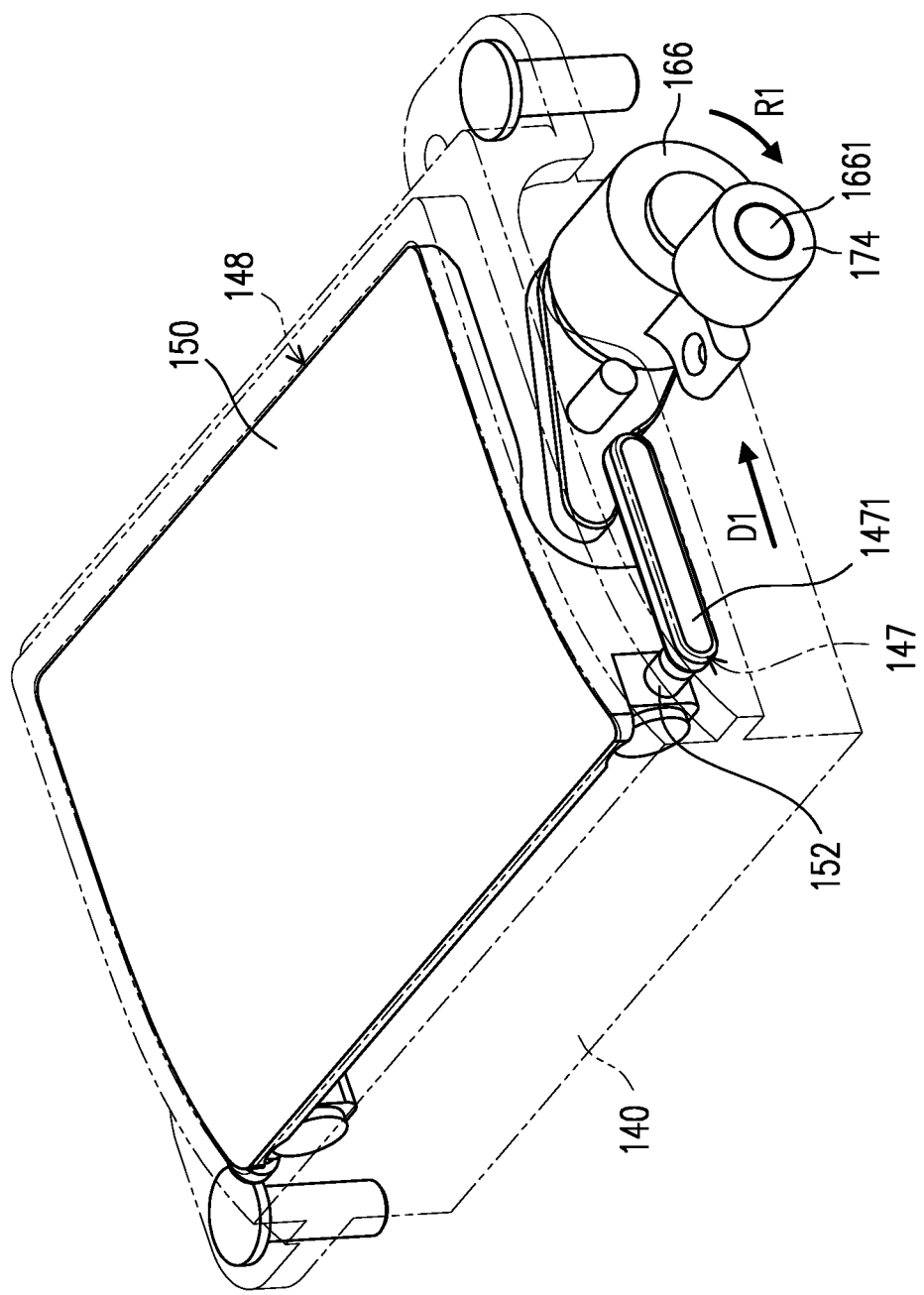
FIG. 5 is another schematic diagram of a door cover structure of the portable electronic device in FIG. 3 in a closed position.

Referring to FIG. 5, in some embodiments, the portable electronic device 100 further includes a waterproof elastic element 1471 disposed in the slide rail 147. In this embodiment, the waterproof elastic element 1471 includes material such as rubber and foam, but the disclosure is not limited thereto. In some embodiments, the waterproof elastic element 1471 is disposed in the slide rail 147 from the outside of the bracket, and the waterproof elastic element 1471 is disposed in interference with the slide rail 147 to prevent water or moisture that permeates into the housing 110 through a bracket opening 148 from permeating to another place (in an embodiment, a circuit board) in the housing 110 through openings such as the slide rail 147 of the bracket 140. In an embodiment, a waterproof elastic element is further disposed at a bottom portion of the bracket 140, so that the bracket 140 is disposed in an interference fit between the bracket 140 and an element below the bracket (in an embodiment, a bottom plate of the portable electronic device 100), to prevent water and moisture that permeate into the housing 110 through the bracket opening 148 from permeating to another place in the housing 110 through the lower part of the bracket 140. In another embodiment, in the disclosure, an interface between each movable element and another element (in an embodiment, a pivot joint between the drive connecting rod 160 and the bracket 140) is coated with high-viscosity lubricating oil, to fill up a gap between elements while lubricating, thereby achieving a waterproof effect.

Referring to FIG. 6 to FIG. 9, this embodiment is similar to the above embodiments. Therefore, this embodiment follows the element symbols and partial contents of the above embodiments, same symbols are used for representing same or similar elements, and the descriptions of the same technical contents are omitted.

Figure 6:
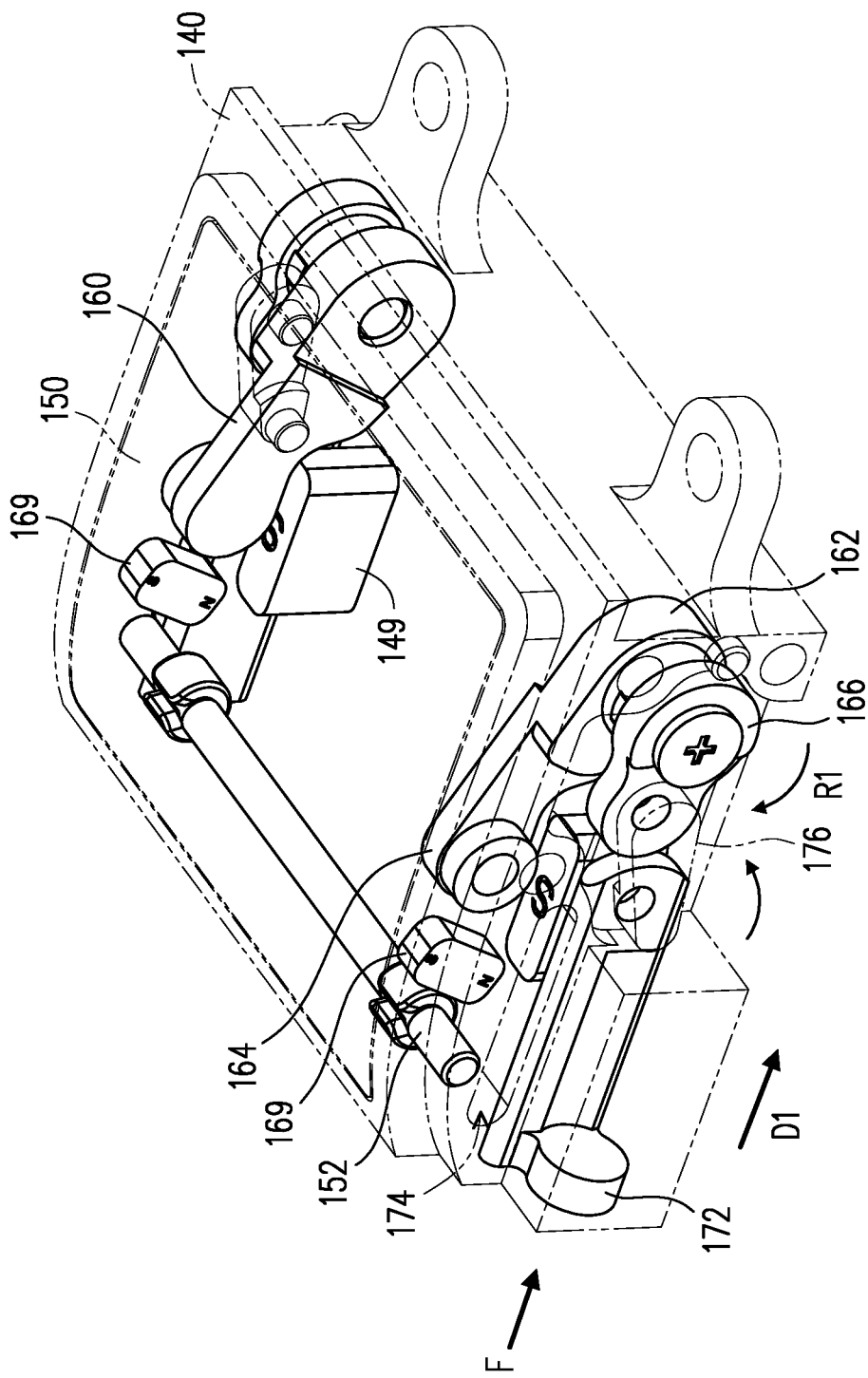
FIG. 6 is a schematic diagram of a door cover structure of a portable electronic device in a closed position according to another embodiment of the disclosure.
Figure 7:
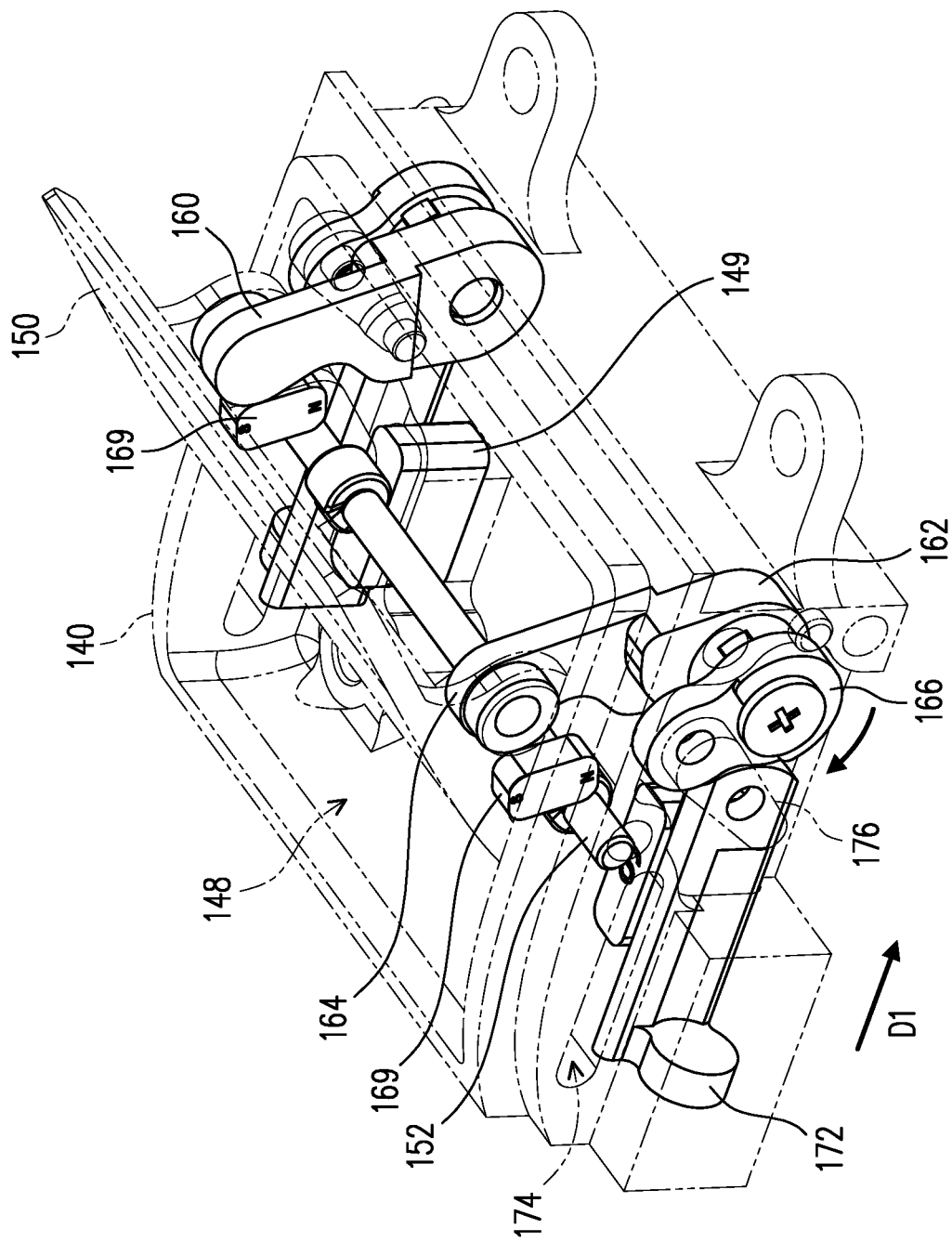
FIG. 7 is a schematic diagram of a door cover structure of the portable electronic device in FIG. 6 in an open position.

Referring to FIG. 6 and FIG. 7 first, in some embodiments, elements of the portable electronic device 100 are further modularized, that is, the door cover structure 150, the drive connecting rod 160, and other related heat dissipation components are assembled on the bracket 140, and then are modularized and assembled into the portable electronic device 100 through the bracket 140 (in an embodiment, a bottom plate or a middle plate in the portable electronic device 100), so that complex assembly steps are simplified. Moreover, the modular design allows an entire module to be tested (in an embodiment, be subject to an operation test) before being assembled in the portable electronic device 100, thereby improving the product yield. In this embodiment, the portable electronic device 100 includes a push rod 172 movably disposed on the bracket 140 and a linkage rod 176. The linkage rod 176 is pivotally connected between the push rod 172 and the drive connecting rod 160. Further, the drive connecting rod 160 further includes a driver 166 engaged with an axle end 162 of the drive connecting rod 160. In such configuration, to cause the door cover structure 150 is to expose the heat dissipation opening 112 for heat dissipation, an external force F is applied to the stressed portion 1721 of the push rod 172 (manually or through a device such as the fan module 200), to move the push rod 172 in a moving direction D1 toward the drive connecting rod 160, so as to drive the linkage rod 176 to rotate and shift to a position shown in FIG. 7. Therefore, the driver 166 is pulled up to drive the axle end 162 of the drive connecting rod 160 to rotate in a rotation direction R1, so as to lift the door cover structure 150 upward. In this way, when the drive connecting rod 160 drives the door cover structure 150 to lift upward, the slider 152 of the door cover structure 150 moves (in an embodiment, roll) along the slide rail 147 of the bracket 140 in a moving direction D1, to further cause the door cover structure 150 to rotate and slide relative to the drive connecting rod 160 to open the door cover structure 150, thereby improving the smoothness of the operation of the door cover structure 150.

Figure 8:
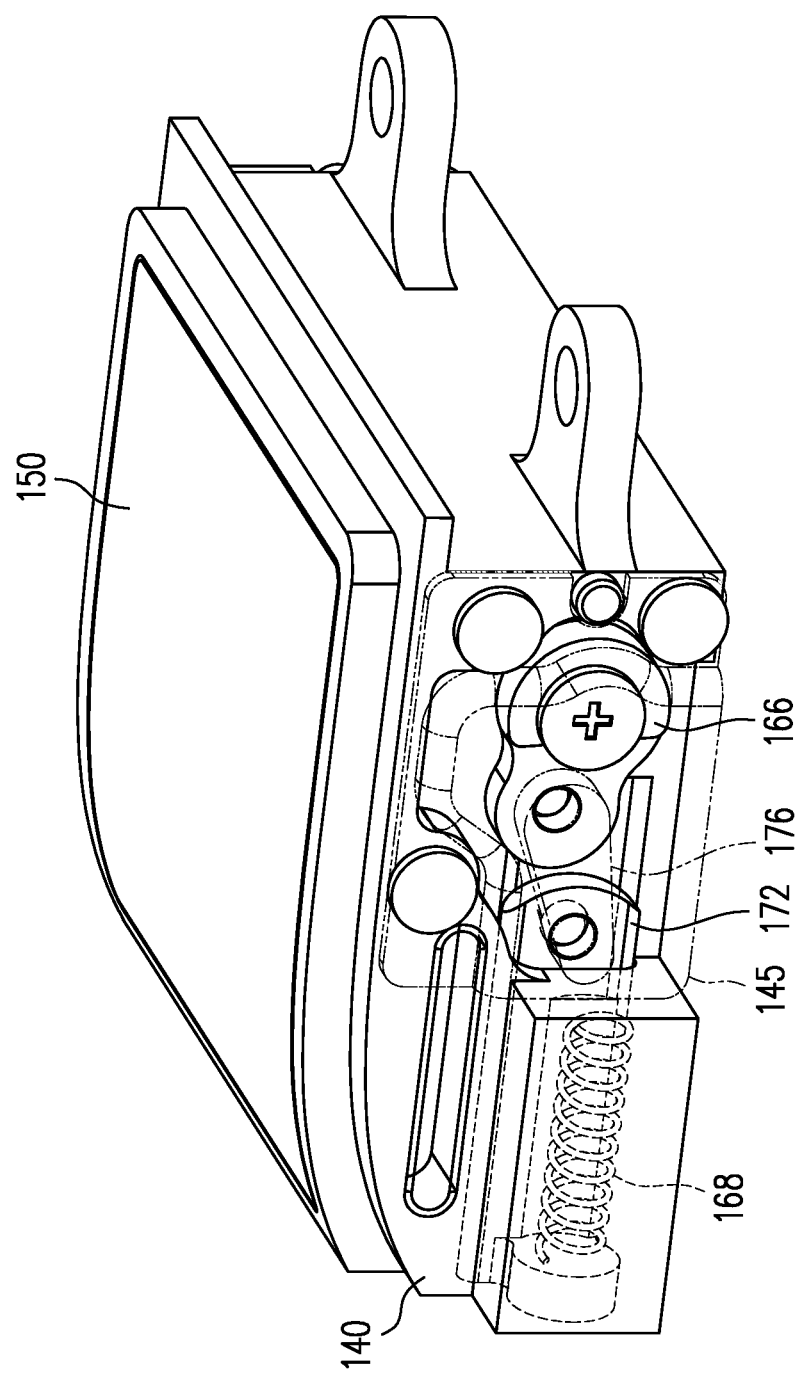
FIG. 8 is another schematic diagram of a door cover structure of the portable electronic device in FIG. 6 in a closed position.

Referring to FIG. 8, in some embodiments, the portable electronic device 100 further includes a limiting member 145, disposed on the bracket 140 to cover and fix at least a part of the drive connecting rod 160 and the linkage rod 176, to prevent the drive connecting rod 160 and the linkage rod 176 from falling off during rotation, and to provide the effect of protecting movable elements. In some embodiments, the limiting member 145 is, in an embodiment, a cover body such as a stamped steel sheet, which is fixed on the bracket 140 by screwing. In some embodiments, the drive connecting rod 160, the linkage rod 176, and the push rod 172 are symmetrically disposed on two opposite sides of the bracket 140 to improve the smoothness of a stroke of the door cover structure 150 between a closed position shown in FIG. 6 and an open position shown in FIG. 7.

Figure 9:
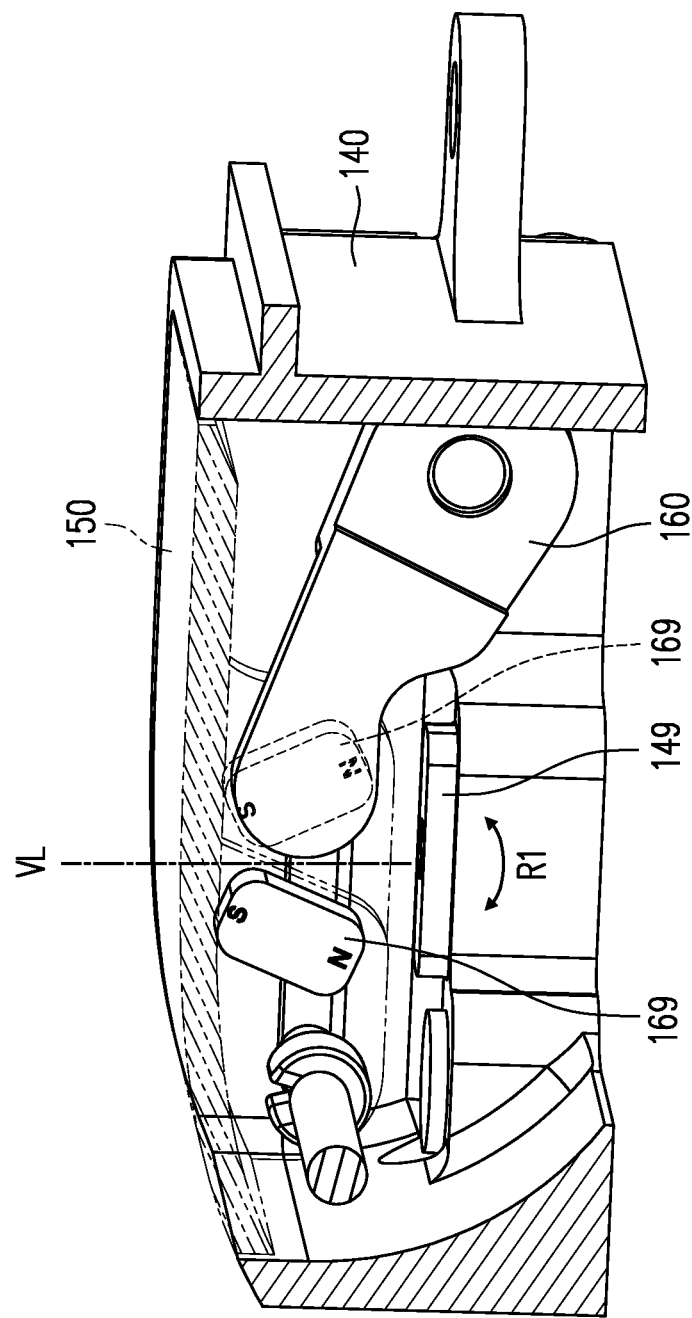
FIG. 9 is a partial cross-sectional schematic diagram of the door cover structure of the portable electronic device in FIG. 6 in a closed position.

Referring to FIG. 8 and FIG. 9, in some embodiments, the drive connecting rod 160 further includes at least one elastic restoring member 168, connected between the push rod 172 and the bracket 140, so that after an external force of pushing the push rod 172 disappears, the push rod 172 and the door cover structure 150 are pulled back to the closed position shown in FIG. 6 by an elastic restoring force of the elastic restoring member. In some embodiments, the portable electronic device 100 further includes at least one first magnetic element 149 and a second magnetic element 169. The first magnetic element 149 is disposed on the bracket 140, and the second magnetic element 169 is correspondingly disposed on the door cover structure 150, and corresponds to the first magnetic element 149, so that when the door cover structure 150 is in a closed position, a closed state of the door cover structure 150 is further stabilized by the property of mutual attraction between the first magnetic element 149 and the second magnetic element 169. Further, the first magnetic element 149 is horizontally disposed on the bracket 140, in an embodiment, and the second magnetic element 169 forms an acute angle with a vertical direction VL, that is, the second magnetic element 169 is not disposed perpendicular to the first magnetic element 149, but is slightly inclined. In this configuration, when the second magnetic element 169 rotates with the door cover structure 150 from a closed position (shown in solid lines) to an open position (shown in dashed lines), it is ensured that the second magnetic element 169 is attracted by the first magnetic element 149 throughout the entire movement stroke, so that the stability of the door cover structure 150 during the movement is maintained.

Figure 10:
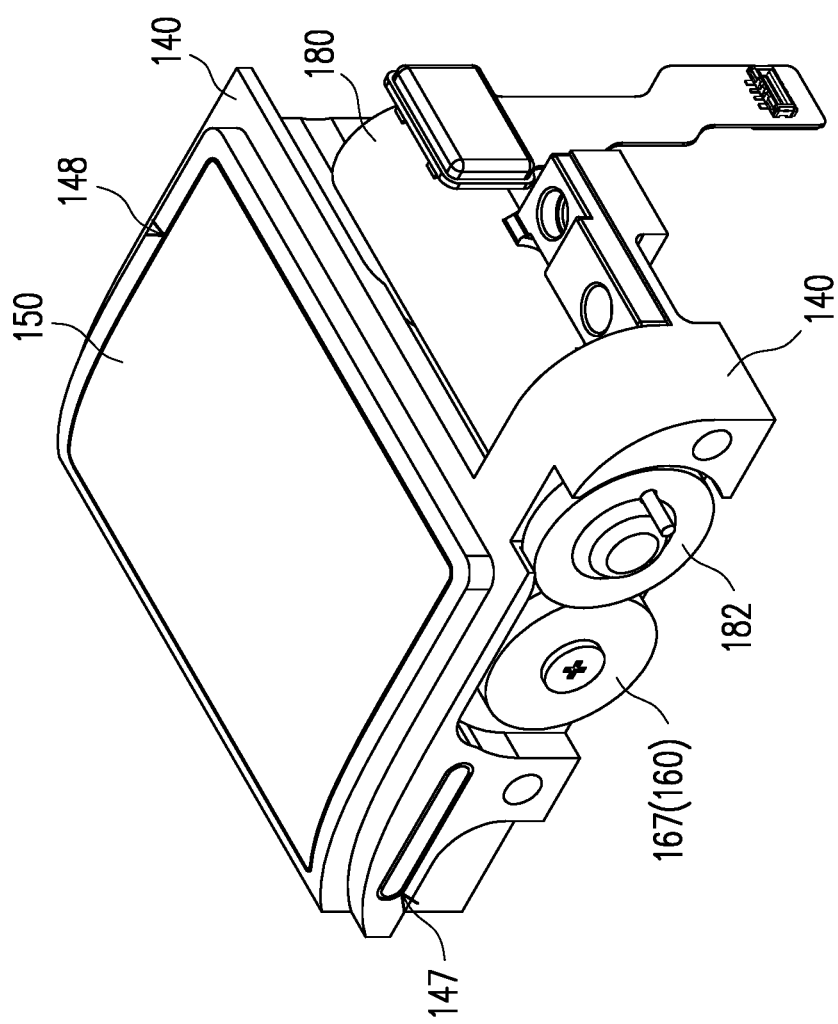
FIG. 10 is a schematic diagram of a door cover structure of a portable electronic device in a closed position according to still another embodiment of the disclosure.
Figure 11:
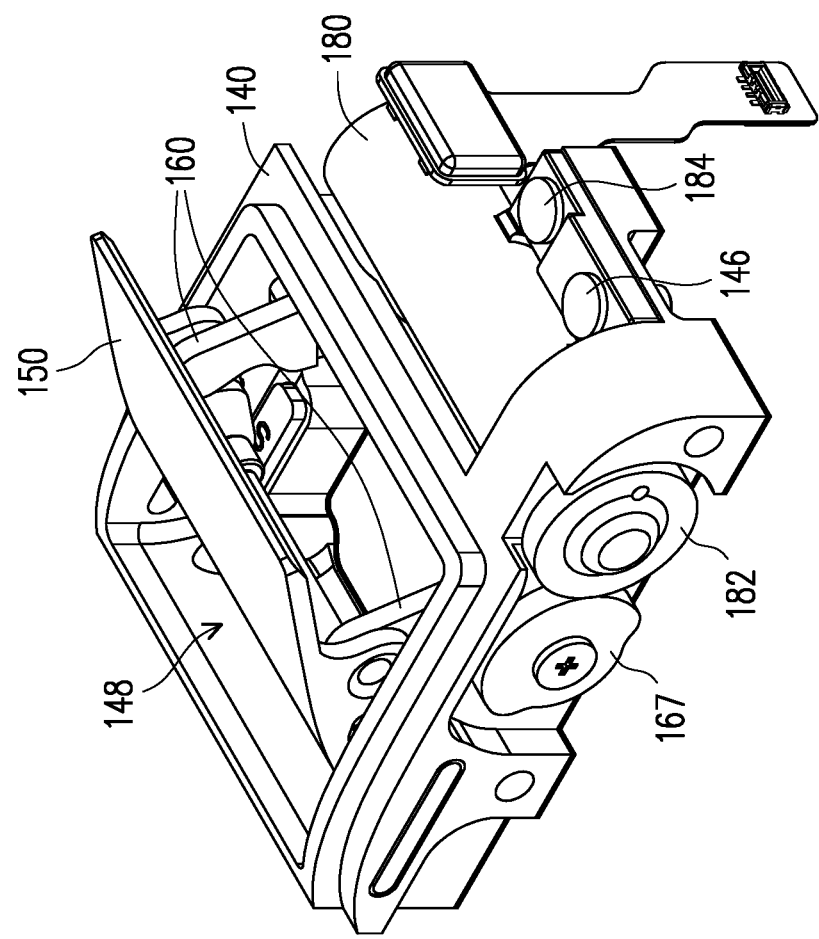
FIG. 11 is a schematic diagram of a door cover structure of the portable electronic device in FIG. 10 in an open position.
Figure 12:
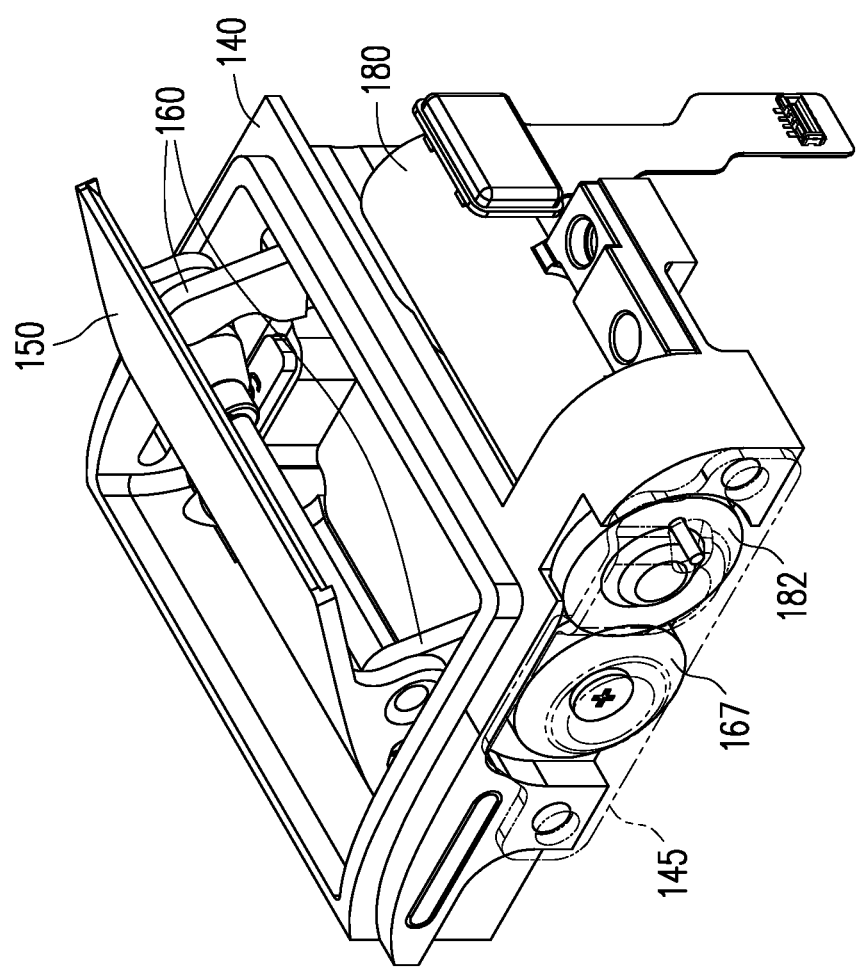
FIG. 12 is another schematic diagram of the door cover structure of the portable electronic device in FIG. 11 in an open position.

Referring to FIG. 10 to FIG. 12, this embodiment follows the element symbols and partial contents of the above embodiments, same symbols are used for representing same or similar elements, and the descriptions of the same technical contents are omitted.

In this embodiment, the portable electronic device 100 further includes a motor 180, which is disposed on the bracket 140 and coupled to the drive connecting rod 160 to drive the drive connecting rod 160 to rotate between the closed position shown in FIG. 10 and the open position shown in FIG. 11. In an embodiment, the motor 180 includes a driving gear 182, and the drive connecting rod 160 correspondingly includes a driven gear 167, where the driving gear 182 of the motor 180 structurally matches the driven gear 167 f the drive connecting rod 160, to drive the drive connecting rod 160 to rotate. In such configuration, the motor 180 drives the driving gear 182 to rotate, to drive the drive connecting rod 160 to rotate through engagement between the driving gear 182 and the driven gear 167, thereby driving the door cover structure 150 move between the closed position shown in FIG. 10 and the open position shown in FIG. 11. In such configuration, when sensing that a temperature of the heating element is higher than a warning temperature, a temperature sensor of the portable electronic device 100 sends a heat dissipation signal to a controller, and the controller accordingly starts the motor 180 to drive the door cover structure 150 to automatically change from a closed position to an open position to facilitate heat dissipation. In another embodiment, driving of the motor 180 also cooperates with the above-mentioned fan module 200 to control opening and closing of the door cover structure 150. In an embodiment, the portable electronic device 100 includes a sensing element (in an embodiment, a magnetic field sensing element or a pressure/contact sensing element), which is used to sense whether the fan module 200 is mounted on the portable electronic device 100. When sensing that the fan module 200 is mounted on the portable electronic device 100, the sensing element transmits a sensing signal to the controller, and the controller accordingly starts the motor 180 to drive the door cover structure 150 to automatically change from the closed position to the open position to facilitate heat dissipation. In this embodiment, the motor 180 is locked to the bracket 140 by a locking member 184, and then, the bracket 140, together with the motor, is locked in the housing 110 (in an embodiment, on a bottom plate in the housing 110) by a locking member 146 to achieve modular assembly. In some embodiments, the driving gear 182 and the driven gear 167 respectively include corresponding teeth to engage with each other and drive each other to rotate. In another embodiment, the driving gear 182 and the driven gear 167 are alternatively friction gears that drive each other to rotate through a friction force therebetween. This embodiment is not limited thereto.

In an embodiment, the portable electronic device 100 further includes a limiting member 145, which is disposed on the bracket 140 to cover and fix the driving gear 182 and the driven gear 167, to prevent the driving gear 182 and the driven gear 167 from falling off during rotation, and to provide the effect of protecting movable elements. In some embodiments, the limiting member 145 is, in an embodiment, a cover body such as a stamped steel sheet, which is fixed on the bracket 140 by screwing.

Referring to FIG. 13 to FIG. 19, this embodiment is similar to the portable electronic device of the above embodiments. Therefore, this embodiment follows the element symbols and partial contents of the above embodiments, same symbols are used for representing same or similar elements, and the descriptions of the same technical contents are omitted.

Figure 13:
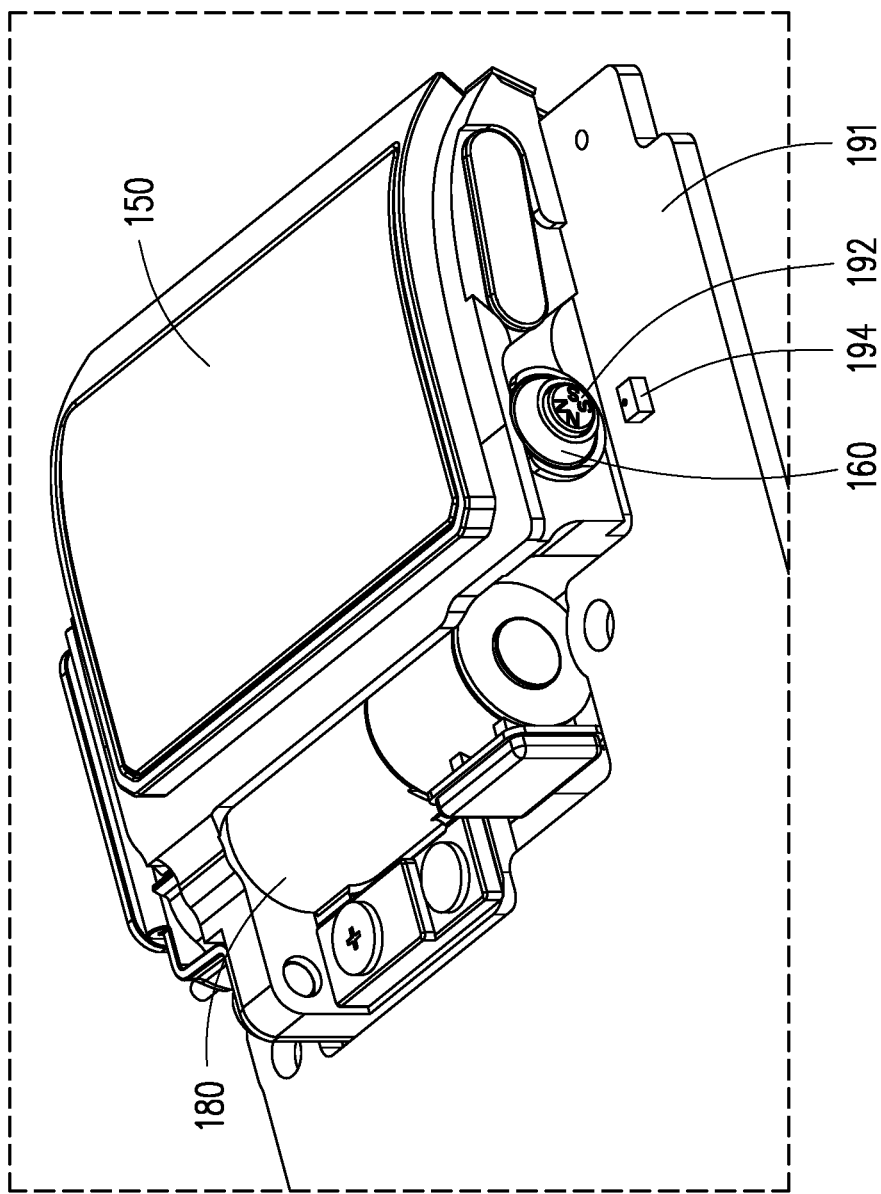
FIG. 13 is a schematic diagram of a door cover structure of a portable electronic device in a closed position according to an embodiment of the disclosure.
Figure 14:
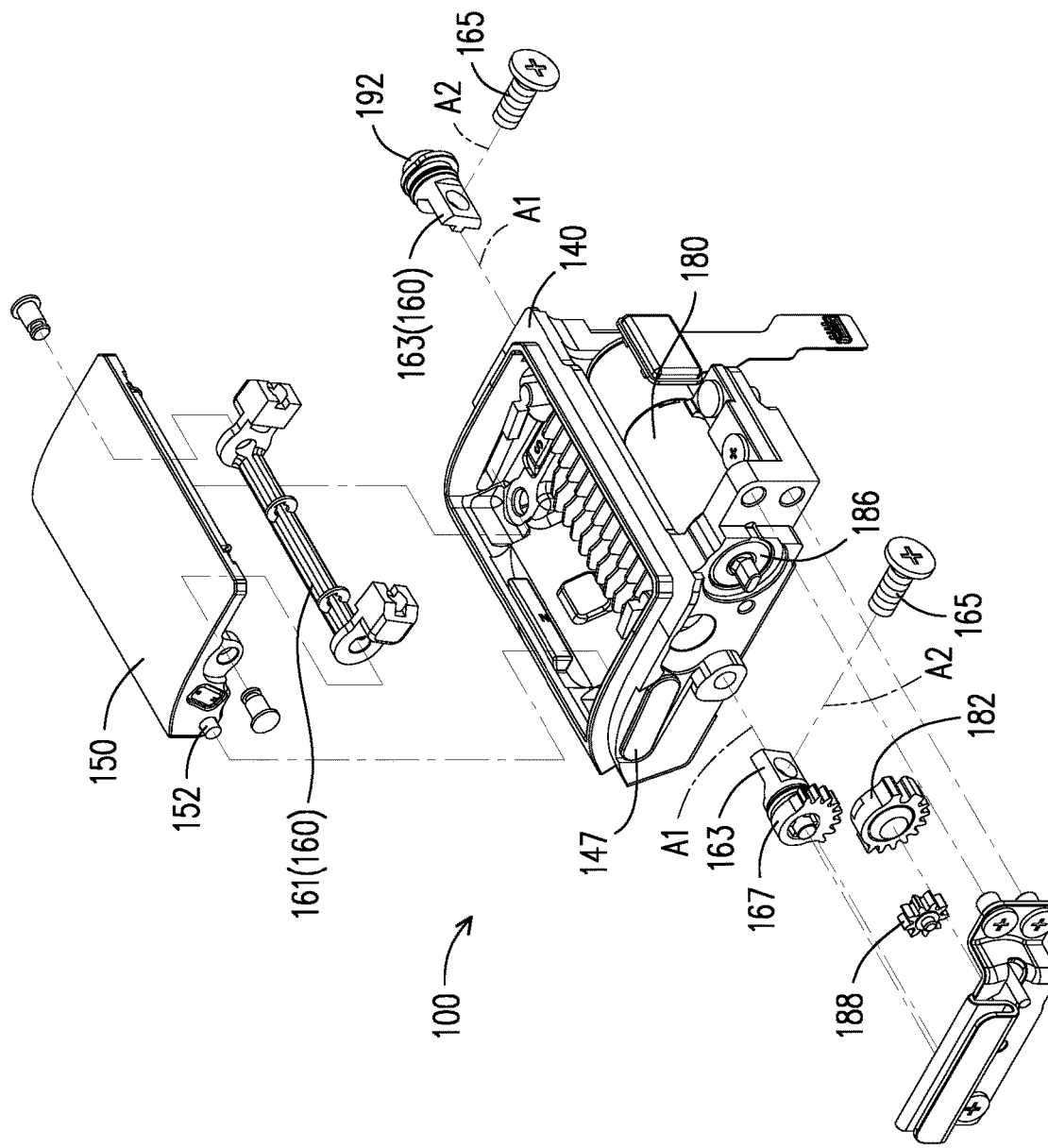
FIG. 14 is a schematic exploded view of some elements of the portable electronic device in FIG. 13.

Referring to FIG. 13 to FIG. 14 first, in some embodiments, the portable electronic device 100 further includes a magnetic element 192 and a magnetic field sensor 194. The magnetic element 192 is disposed on the drive connecting rod 160 and is adapted to rotate with the drive connecting rod 160. The magnetic field sensor 194 is disposed on a circuit board 191, in an embodiment, and is configured to determine a state of the door cover structure 150 according to a change in a magnetic field of the magnetic element 192. In this embodiment, the magnetic field sensor 194 is, in an embodiment, a Hall sensor or the like. Further, the portable electronic device 100 further includes a processor coupled to the magnetic field sensor 194. In this way, when a state of the door cover structure 150 changes (in an embodiment, when the door cover structure 150 is opened or closed), the magnetic member 192 rotates with the drive connecting rod 160, the magnetic field sensor 194 senses a change in a magnetic field of the magnetic member 192 and transmits a sensing signal to a processor accordingly. The processor determines a state of the door cover structure 150 accordingly. In such configuration, the processor determines whether the door cover structure 150 is in an open or a closed state according to a rotation angle of the drive connecting rod 160, and even calculates any position of the door cover structure 150 in an opening or closing stroke. Therefore, when the door cover structure 150 is abnormally opened due to an impact, an improper operation, or another accident, the processor learns this situation using this mechanism (the cooperation between the magnetic element 192 and the magnetic field sensor 194), and closes the door cover structure 150. When mounting accessories such as the fan module 200, a user detects, by using this mechanism, whether the door cover structure 150 is fully opened. Moreover, this mechanism also controls the door cover structure 150 to stay at any angle to achieve operations such as a half-open state.

In an embodiment, the drive connecting rod 160 is coupled to a main connecting rod 161 of the driven gear 167, where the driven gear 167 structurally matches the driving gear 182 of the motor 180 as described above, to be driven by the driving gear 182 to rotate. The main connecting rod 161 connects two opposite sides of the door cover structure 150. In such configuration, when the driven gear 167 is driven by the motor 180 to rotate, the driven gear 167 drives the main connecting rod 161 of the drive connecting rod 160 to move (rotate to lift upward or downward), and further simultaneously drives the two opposite sides of the door cover structure 150 to move (upward or downward) together. That is, in this embodiment, the main connecting rod 161 connecting the two opposite sides of the door cover structure 150 is used, to directly transfer a driving force of the motor 180 in an axial direction of the main connecting rod 161 to the other side of the door cover structure 150, thereby reducing the delay of transmission between parts due to an assembly gap. Therefore, the deflection of the door cover structure 150 is avoided, so that the operation of opening and closing the door cover structure 150 is smoother.

In an embodiment, the drive connecting rod 160 further includes an adapter 163 and a locking member 165. The adapter 163 is coupled between the driven gear 167 and the main connecting rod 161. The driven gear 167 rotates in an axial direction A1. The locking member 165 locks the adapter 163 on the main connecting rod 161 in a direction parallel to a radial direction A2 of the driven gear 167. The axial direction A1 and the radial direction A2 are substantially perpendicular to each other. Such a locking method (compared to a locking method in an axial direction of the driven gear 167) avoids the problem of loosening of the locking member 165 due to reciprocating rotation between the driven gear 167 and the main connecting rod 161. The locking member 165 is, in an embodiment, a proper locking member such as a screw.

Figure 15:
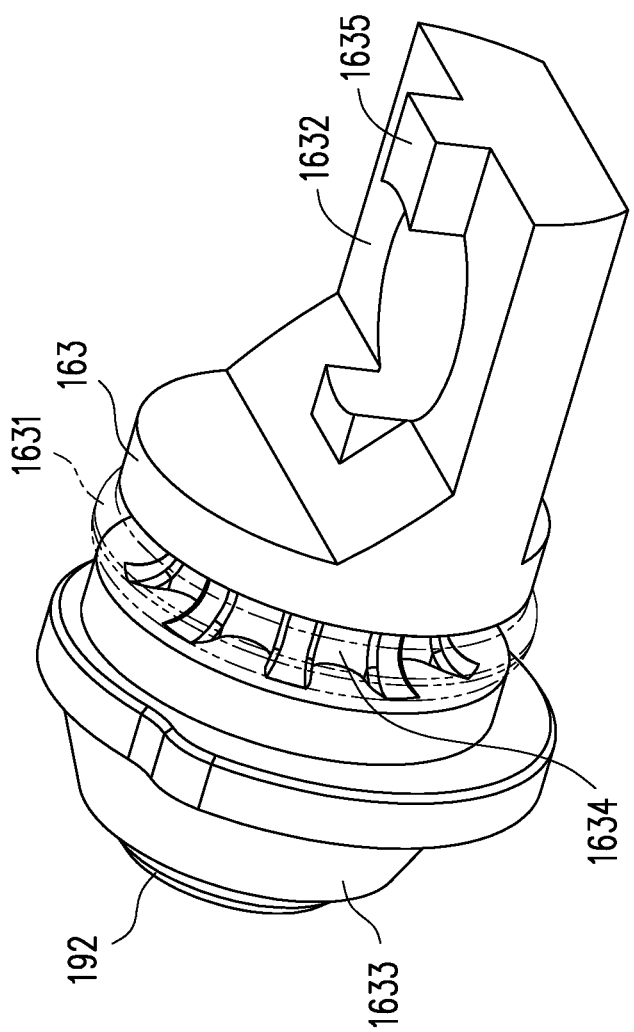
FIG. 15 is a schematic diagram of an adapter of the portable electronic device in FIG. 13.

Referring to FIG. 14 and FIG. 15, in some embodiments, the adapter 163 further includes a first end 1632 and a second end 1633 opposite to each other, and a buffer ring 1631 sleeved between the first end 1632 and the second end 1633. In this embodiment, the first end 1632 is coupled to the main connecting rod 161. The second end 1633 is coupled to the driven gear 167, or a magnetic element 192 is disposed at the second end 1633. The buffer ring 1631 is, in an embodiment, a rubber gasket, sleeved between the first end 1632 and the second end 1633 to provide frictional torque. In such configuration, through an interference fit between the buffer ring 1631 and the bracket 140, the frictional torque provided by the buffer ring 1631 causes the door cover structure 150 to stay in any state (position) between opening and closing, and the door cover structure 150 does not shake or fall due to the gravity or another external force.

In an embodiment, the door cover structure 150 further includes an elastic member such as rubber, which is disposed on a surface of the door cover structure 150 facing the bracket 140 (in an embodiment, two opposite side surfaces). In other words, the elastic member is fitted between the door cover structure 150 and the bracket 140 to provide friction when the door cover structure 150 moves (rotate and/or shift) relative to the bracket 140, thereby improving the stability of the door cover structure 150 during movement. In some embodiments, a body of the adapter 163 and the buffer ring 1631 include limiting structures (in an embodiment, a rib 1634 shown in FIG. 15 or another proper limiting structure) that match each other, to prevent the body of the adapter 163 from falling off the buffer ring 1631. In an embodiment, the buffer ring 1631 is formed by molding rubber on the metal adapter 163 through in-mold injection or injection molding, or the buffer ring 1631 is made separately and then be fitted on the adapter 163, which is not limited in this embodiment.

In addition, in some embodiments, the main connecting rod 161 and the adapter 163 limiting structures (in an embodiment, the rib 1635 shown in FIG. 15 or another proper limiting structure) that match each other, to prevent the main connecting rod 161 and the adapter 163 from being misaligned during assembly. In addition, in some embodiments, the buffer ring 1631 that is radially stressed on the adapter 163 also achieves the effect of waterproofing. In an embodiment, the buffer ring 1631 is coated with high-viscosity lubricating oil or another medium to reduce damage suffered by the buffer ring 1631 during assembly or rotation and also fill up a gap caused by an interference fit or a part tolerance, thereby achieving the effect of waterproofing.

Figure 16:
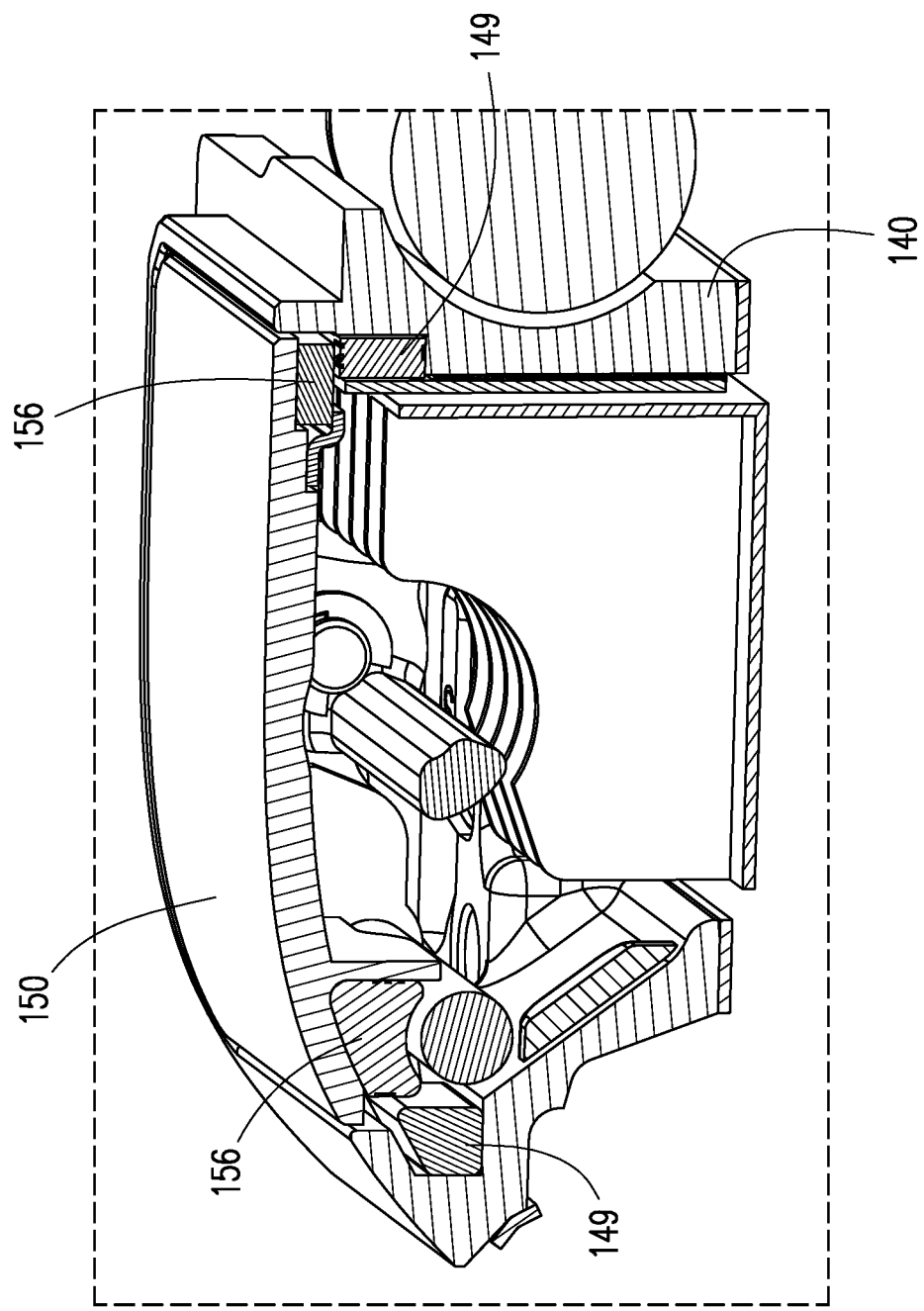
FIG. 16 is a schematic partial cross-sectional diagram of the portable electronic device in FIG. 13.

Referring to FIG. 16, in an embodiment, the portable electronic device 100 further includes at least one first magnetic element 149 and a second magnetic element 156 that attract each other. In this embodiment, the first magnetic element 149 is disposed on the bracket 140, and the second magnetic element 156 is correspondingly disposed on the door cover structure 150, and corresponds to the first magnetic element 149 when being disposed in a closed position, so that when the door cover structure 150 is in the closed position, a closed state of the door cover structure 150 is further stabilized by the property of mutual attraction between the first magnetic element 149 and the second magnetic element 156. Therefore, a risk of opening the door cover structure 150 by accident (collision or misoperation) is reduced. A plurality of attraction combinations of magnetic elements (in an embodiment, the magnetic element 149 on the bracket and the magnetic element 156 on the corresponding door cover structure 150 and/or the magnetic element 169 on the corresponding drive connecting rod 160) of the disclosure does not necessarily need to exist at the same time provided that an attraction force between the magnetic elements is sufficient to achieve the objective of stabilizing the door cover structure 150.

Figure 17:
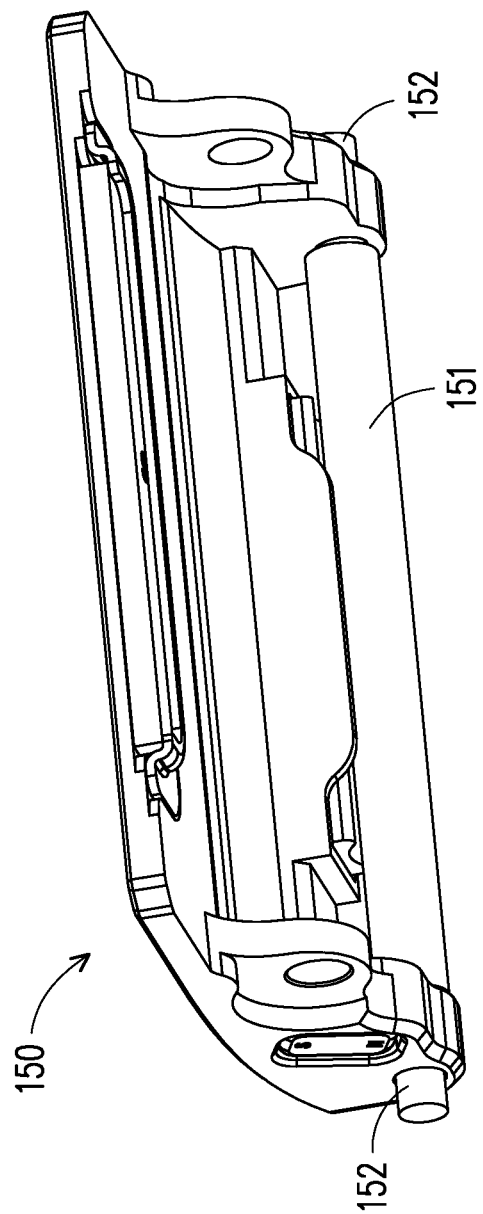
FIG. 17 is a schematic diagram of the door cover structure of the portable electronic device in FIG. 13.

Referring to FIG. 14 and FIG. 17, in an embodiment, the slider 152 of the door cover structure 150 is implemented in a form of a retractable slide rod 151, and extends through the two opposite sides of the door cover structure 150 to be slidably disposed on the slide rail 147 of the bracket 140. Specifically, the retractable slide rod 151 is a rod with an internal compression spring, and two opposite ends of the retractable slide rod 151 (slider 152) are completely retracted after being stressed, and spring back to an initial state (original length) when an external force disappears. In this way, during assembly, two ends of the retractable slide rod 151 (slider 152) are retracted first. Then after the retractable slide rod 151 is pushed to corresponding door holes of the door cover structure 150, the internal spring is released, so that the two opposite ends (slider 152) pass through the corresponding door holes and enter the slide rails 147 of the bracket 140, thereby improving the assembly efficiency. The retractable slide rod 151 moves (roll)s in the slide rails 147, to improve the smoothness of the operation of the door cover structure 150.

Figure 18:
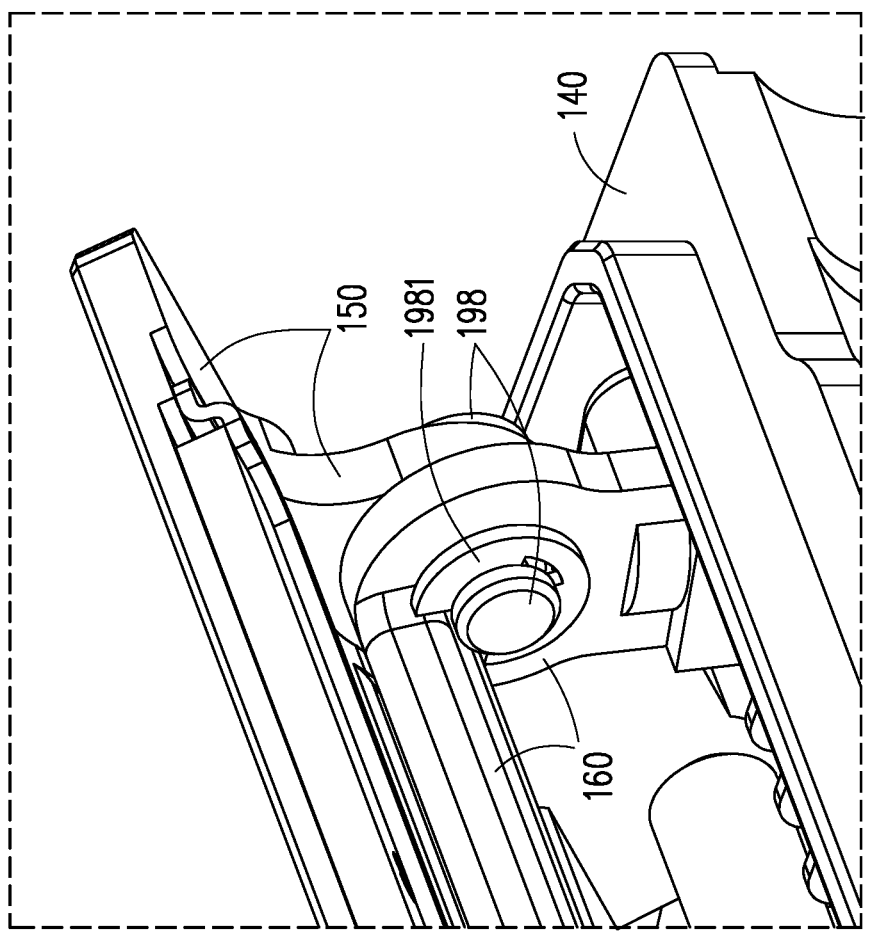
FIG. 18 is a schematic partial enlarged diagram of the portable electronic device in FIG. 13.

Referring to FIG. 18, in some embodiments, the portable electronic device 100 further includes a pivot member 198 pivotally connected between the drive connecting rod 160 (in an embodiment, the main connecting rod 161) and the door cover structure 150. The pivot member 198 respectively passes through the drive connecting rod 160 and the door cover structure 150 and includes a neck with a smaller outer diameter for a fastener 1981 to be buckled on the neck, thereby preventing the pivot member 198 from falling off. In addition, other parts of the pivot member 198 are respectively pivotally connected to the drive connecting rod 160 and the door cover structure 150 to rotate relative to each other.

In an embodiment, the design of the buckle ring 1981 provide friction and torque for a pivot connection between the drive connecting rod 160 and the door cover structure 150, to increase the stability of the door cover structure 150 during operation. In addition, in another embodiment, the pivot member 198 is alternatively directly welded to one of the drive connecting rod 160 or the door cover structure 150. In another embodiment, the pivot member is alternatively, in an embodiment, a stamped cylindrical structure that respectively passes through the drive connecting rod 160 and the door cover structure 150 and that has limiting side skirts manufactured by riveting. The disclosure does not limit a form of the pivot member.

Figure 19:
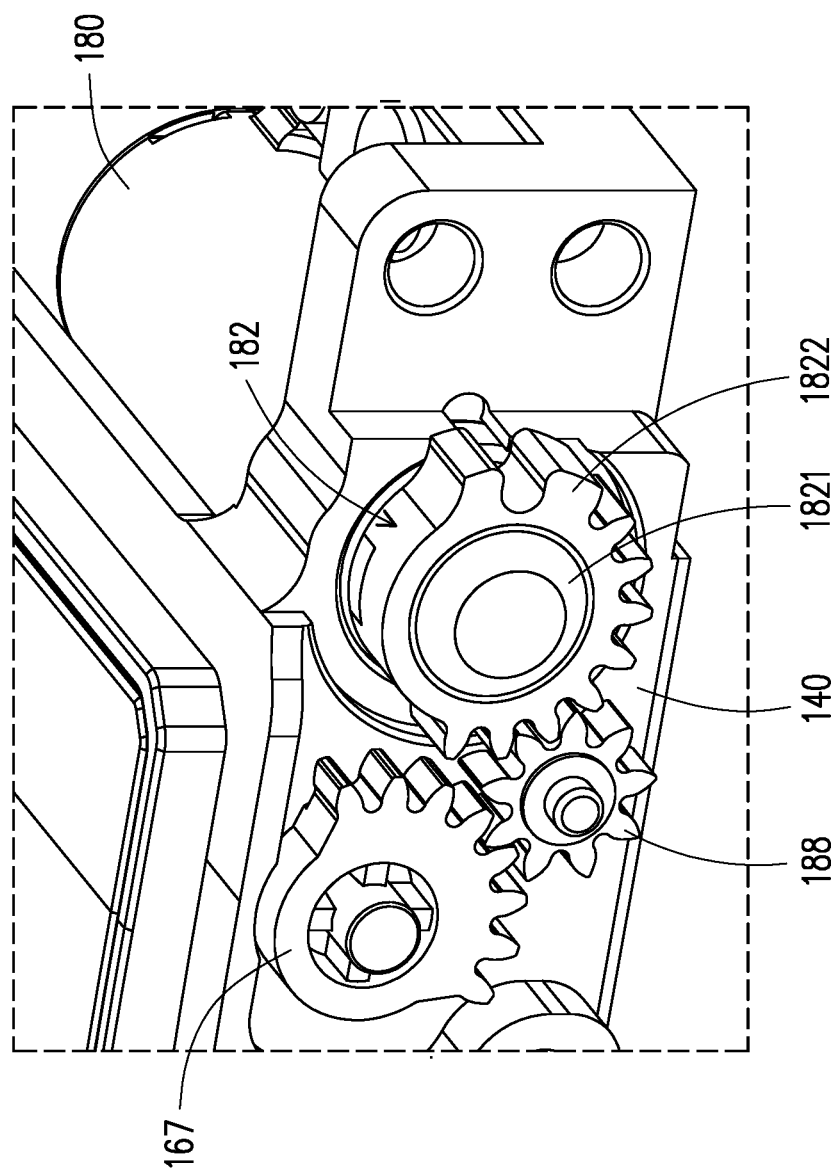
FIG. 19 is another schematic partial enlarged diagram of the portable electronic device in FIG. 13.

Referring to FIG. 14 and FIG. 19, in an embodiment, the portable electronic device 100 further includes an intermediate gear 188, disposed between the driving gear 182 and the driven gear 167, and configured to respectively match the driving gear 182 and the driven gear 167 structure, so that the driving gear 182 drives the driven gear 167 to rotate through the intermediate gear 188. In this configuration, the center distance and the gear size of the intermediate gear 188 are designed to reduce the individual volumes of individual gears, so that a gear set (the driving gear 182, the intermediate gear 188, and the driven gear 167) is completely accommodated between the body of the bracket 140 and a limiting member (the limiting member 145 shown in FIG. 12).

In addition, in some embodiments, the driving gear 182 includes an elastic core portion 1821 engaged with a drive shaft of the motor 180 and a gear portion 1822 surrounding the elastic core portion 1821. The elastic core portion 1821 and the gear portion 1822 are made of different materials. In an embodiment, the material of the elastic core portion 1821 include plastic materials such as polyoxymethylene (POM), and the material of the gear portion 1822 includes metal materials such as stainless steel and iron-nickel alloy. In this way, the property that the elastic core portion 1821 is prone to deform locally is used, so that the driving gear 182 and the drive shaft of the motor 180 are tightly matched, to reduce an idle stroke in the transmission. The gear portion 1822 is made of materials with higher breaking strength, such as metal, to achieve wear resistance. In this embodiment, a buckle position is designed between the elastic core portion 1821 and the gear portion 1822. After being machined, metal is placed in a plastic injection mold, and is then manufactured through embedding and injection. In another embodiment, the driving gear 182 is alternatively entirely made of plastic materials such as POM. This method reduces running noise of the driving gear 182 and costs of parts. Referring to FIG. 14 again, in some embodiments, the portable electronic device 100 further includes a ball bearing 186, which is assembled at a junction of the bracket 140 and the motor 180. The ball bearing 186 is used to surround a drive shaft of the rotating motor 180, so that the drive shaft of the motor 180 rotates stably, and further has the function of stabilizing the rotation of the driving gear 182.

In summary, a housing of a portable electronic device disclosed in the disclosure includes a heat dissipation opening, used to expose at least a part of the heat dissipation element in the housing. In addition, the portable electronic device further includes a door cover structure, and drives the door cover structure to move (shift and/or rotate) through a drive connecting rod pivotally connected between the bracket and the door cover structure to cover or expose the heat dissipation opening. Elements, such as the door cover structure and the drive connecting rod, are assembled in the portable electronic device in a modular manner through the bracket. When the portable electronic device has a relatively high heat dissipation requirement, the door cover structure is opened manually or automatically to enhance heat dissipation efficiency. Moreover, the modular design not only simplifies cumbersome assembly steps, but also allows an entire module to be tested (in an embodiment, be subject to an operation test) before being assembled in the portable electronic device, thereby improving the product yield.

In addition, the portable electronic device further includes a fan module sleeved on the housing. In this way, when there is a relatively high need for heat dissipation, the fan module is sleeved on the housing to be combined with the portable electronic device and help the portable electronic device dissipate heat. In addition, in some embodiments, the portable electronic device drives the door cover structure to rotate to an open position while assembling the fan module on the housing, thereby improving the operating convenience of the device.

What is claimed is:

1. A portable electronic device, comprising:
a housing, comprising a heat dissipation opening;
a heat dissipation element, disposed in the housing and corresponding to the heat dissipation opening;
a bracket, disposed in the housing and framing the heat dissipation element;
a drive connecting rod, pivotally connected to the bracket and adapted to be driven to rotate;
a door cover structure, coupled to the bracket, wherein the drive connecting rod is pivotally connected to the door cover structure to drive the door cover structure to move to cover or expose the heat dissipation opening; and
a push rod and a drive roller connected to the drive connecting rod, wherein the push rod comprises a stressed portion and a slope portion, and the stressed portion is adapted to be pushed by an external force to move in a direction of the drive roller, so that the drive roller lifts upward along the slope portion to drive the drive connecting rod to rotate.

2. The portable electronic device according to claim 1, wherein the drive connecting rod comprises an axle end and a pivot end opposite to each other, the axle end is connected to the drive roller, and the pivot end is pivotally connected to the door cover structure.

3. The portable electronic device according to claim 1, wherein the bracket further comprises a slide rail, the door cover structure comprises a slider slidably disposed in the slide rail and a pivot portion pivotally connected to the drive connecting rod, and when the drive connecting rod drives the pivot portion of the door cover structure to rotate, the slider moves along the slide rail.

4. The portable electronic device according to claim 3, further comprising a waterproof elastic element, disposed in the slide rail.

5. The portable electronic device according to claim 1, further comprising a first magnetic element and a second magnetic element that attract each other, wherein the first magnetic element is disposed on the bracket, and the second magnetic element is disposed on the drive connecting rod or the door cover structure to correspond to the first magnetic element.

6. The portable electronic device according to claim 1, the push rod movably disposed on the bracket and a linkage rod pivotally connected between the push rod and the drive connecting rod, wherein the push rod is adapted to be pushed by the external force to move in a direction of the drive connecting rod, and then drives the linkage rod to drive the drive connecting rod to rotate.

7. The portable electronic device according to claim 6, further comprising a limiting member, disposed on the bracket to cover and fix at least a part of the drive connecting rod and the linkage rod.

8. The portable electronic device according to claim 1, further comprising a motor, disposed on the bracket and coupled to the drive connecting rod to drive the drive connecting rod to rotate.

9. The portable electronic device according to claim 8, wherein the motor comprises a driving gear cooperating with a driven gear structure of the drive connecting rod to drive the drive connecting rod to rotate.

10. The portable electronic device according to claim 1, further comprising a magnetic element and a magnetic field sensor, wherein the magnetic element is disposed on the drive connecting rod to rotate with the drive connecting rod, and the magnetic field sensor is configured to determine a state of the door cover structure according to a change in a magnetic field of the magnetic element.

11. The portable electronic device according to claim 1, wherein the drive connecting rod comprises a driven gear and a main connecting rod coupled to the driven gear, the driven gear cooperates with a driving gear structure of a motor, and the main connecting rod connects opposite sides of the door cover structure to simultaneously drive the opposite sides of the door cover structure to move when the driven gear is driven to rotate by the motor.

12. The portable electronic device according to claim 11, wherein the drive connecting rod further comprises an adapter and a locking member coupled between the driven gear and the main connecting rod, wherein the locking member is parallel to a radial direction of the driven gear and lock the adapter on the main connecting rod.

13. The portable electronic device according to claim 3, wherein the slider comprises a retractable slide rod, extending through opposite sides of the door cover structure to be slidably disposed on the slide rail.

14. The portable electronic device according to claim 1, further comprising a pivot member, pivotally connected between the drive connecting rod and the door cover structure.

15. The portable electronic device according to claim 9, further comprising an intermediate gear, disposed between the driving gear and the driven gear and respectively cooperating with the driving gear and the driven gear structure.

16. The portable electronic device according to claim 9, wherein the driving gear comprises an elastic core portion engaged with the motor and a gear portion surrounding the elastic core portion.

* * * * *